United States Patent
Yang et al.

(10) Patent No.: US 10,096,355 B2
(45) Date of Patent: Oct. 9, 2018

(54) DYNAMIC MANAGEMENT OF PROGRAMMING STATES TO IMPROVE ENDURANCE

(71) Applicant: SanDisk Technologies Inc., Plano, TX (US)

(72) Inventors: Nian Niles Yang, Mountain View, CA (US); Abhijeet Manohar, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 105 days.

(21) Appl. No.: 14/842,550

(22) Filed: Sep. 1, 2015

(65) Prior Publication Data

US 2017/0062069 A1 Mar. 2, 2017

(51) Int. Cl.
| | |
|---|---|
| *G11C 11/56* | (2006.01) |
| *G06F 12/02* | (2006.01) |
| *G11C 16/34* | (2006.01) |
| *G06F 11/10* | (2006.01) |
| *G11C 29/02* | (2006.01) |
| *G11C 29/00* | (2006.01) |
| *G11C 29/52* | (2006.01) |
| *G11C 16/24* | (2006.01) |
| *G11C 29/04* | (2006.01) |

(52) U.S. Cl.
CPC ...... *G11C 11/5628* (2013.01); *G06F 11/1012* (2013.01); *G06F 11/1068* (2013.01); *G06F 11/1072* (2013.01); *G06F 11/1076* (2013.01); *G06F 12/0246* (2013.01); *G11C 11/5642* (2013.01); *G11C 16/349* (2013.01); *G11C 16/3445* (2013.01); *G11C 16/3454* (2013.01); *G11C 16/3495* (2013.01); *G11C 29/021* (2013.01); *G11C 29/028* (2013.01); *G11C 29/78* (2013.01); *G11C 16/24* (2013.01); *G11C 29/52* (2013.01); *G11C 2029/0401* (2013.01)

(58) Field of Classification Search
CPC ............ G11C 11/5628; G11C 16/3495; G11C 16/349; G11C 16/3454; G06F 12/0246; G06F 11/1072; G06F 11/1068
See application file for complete search history.

(56) References Cited

U.S. PATENT DOCUMENTS

| | | | |
|---|---|---|---|
| 5,930,167 A | 7/1999 | Lee et al. | |
| 6,532,169 B1 * | 3/2003 | Mann | G11C 14/00 365/154 |

(Continued)

*Primary Examiner* — Joseph D Torres
(74) *Attorney, Agent, or Firm* — Brinks Gilson & Lione

(57) ABSTRACT

A storage device with a memory may include improved endurance and programming speed by modifying the programming states of the memory blocks. For example, the blocks may be three bit memory blocks, but a dynamic reassignment of verify levels and read margins can result in the block acting like a two bit memory block. Memory blocks may be designed for a certain number of bits per cell (i.e. number of states) and the programming is based on that number. However, single level cell (SLC) programming is still possible in addition to programming according to the number of bits per cell that the memory is designed for. Multiple SLC programming steps can be used to modify the number of states for certain memory cells by the memory controller.

19 Claims, 9 Drawing Sheets

(56) References Cited

U.S. PATENT DOCUMENTS

| | | | | |
|---|---|---|---|---|
| 7,218,551 B2* | 5/2007 | Roohparvar | G11C 11/5628 | 365/185.09 |
| 7,308,525 B2* | 12/2007 | Lasser | G11C 11/5621 | 365/185.03 |
| 7,436,705 B2* | 10/2008 | Roohparvar | G11C 11/5628 | 365/185.09 |
| 7,508,732 B2* | 3/2009 | Park | G11C 11/5628 | 365/185.17 |
| 7,545,673 B2* | 6/2009 | Lasser | G11C 11/5628 | 365/185.03 |
| 7,593,263 B2* | 9/2009 | Sokolov | G11C 16/26 | 365/185.03 |
| 7,646,636 B2* | 1/2010 | Kim | G06F 12/0246 | 365/168 |
| 8,072,804 B2* | 12/2011 | Lee | G11C 11/5628 | 365/185.03 |
| 8,341,331 B2* | 12/2012 | Meir | G06F 12/0246 | 711/103 |
| 8,730,725 B2 | 5/2014 | Huang et al. | | |
| 8,886,911 B2* | 11/2014 | Nemazie | G11C 16/0483 | 711/129 |
| 8,898,374 B2* | 11/2014 | Yang | G06F 12/0246 | 365/185.01 |
| 8,995,184 B2* | 3/2015 | Takafuji | G11C 11/5621 | 365/185.03 |
| 9,021,177 B2* | 4/2015 | Segal | G06F 12/0246 | 711/103 |
| 9,274,893 B2* | 3/2016 | Chen | G06F 11/1402 | |
| 9,588,883 B2* | 3/2017 | Kim | G06F 12/0246 | |
| 9,632,866 B2* | 4/2017 | Calderbank | G06F 11/1016 | |
| 2005/0180209 A1* | 8/2005 | Lasser | G11C 11/5621 | 365/185.03 |
| 2005/0273549 A1* | 12/2005 | Roohparvar | G11C 11/56 | 711/103 |
| 2006/0004952 A1* | 1/2006 | Lasser | G11C 11/5621 | 711/103 |
| 2007/0061502 A1* | 3/2007 | Lasser | G06F 12/0246 | 711/103 |
| 2008/0123412 A1* | 5/2008 | Lasser | G11C 11/5621 | 365/185.03 |
| 2008/0172520 A1* | 7/2008 | Lee | G11C 11/5628 | 711/103 |
| 2008/0172521 A1* | 7/2008 | Lee | G11C 11/5628 | 711/103 |
| 2008/0198651 A1* | 8/2008 | Kim | G06F 12/0246 | 365/185.03 |
| 2008/0222353 A1* | 9/2008 | Nam | G06F 3/0614 | 711/113 |
| 2010/0020601 A1* | 1/2010 | Lee | G11C 11/5628 | 365/185.03 |
| 2010/0232240 A1* | 9/2010 | Norman | G11O 5/02 | 365/200 |
| 2011/0208896 A1* | 8/2011 | Wakrat | G06F 12/0246 | 711/103 |
| 2013/0080730 A1* | 3/2013 | Kim | G06F 12/0246 | 711/203 |
| 2013/0124787 A1* | 5/2013 | Schuette | G06F 12/0246 | 711/103 |
| 2014/0129874 A1* | 5/2014 | Zaltsman | G06F 11/108 | 714/6.11 |
| 2014/0160842 A1* | 6/2014 | Takafuji | G11C 11/5621 | 365/185.03 |
| 2015/0213896 A1* | 7/2015 | Lieber | G06F 3/061 | 711/103 |

* cited by examiner

US 10,096,355 B2

DYNAMIC MANAGEMENT OF PROGRAMMING STATES TO IMPROVE ENDURANCE

TECHNICAL FIELD

This application relates generally to memory devices. More specifically, this application relates to improving endurance and faster programming by reassigning programming states.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. NAND is one example of a non-volatile flash memory. Flash memory may have a limited endurance, which determines a number of times a particular memory can be erased and re-programmed. As the non-volatile memory cell scales to smaller dimensions with higher capacity per unit area, the cell endurance due to program and erase cycling, and disturbances (e.g. due to either read or program) may become more prominent. The overall vulnerability of memory cells and the defect level during the silicon process may become elevated as the cell dimension shrinks and process complexity increases, which directly affects the data integrity at both the memory and system. For example, with an increase in the number of bits per cell, the bit error rate may increase as both programming and reading must be more exact.

DESCRIPTION OF THE EMBODIMENTS

A storage device with a memory may include improved endurance and programming speed by modifying the programming states of the memory blocks. For example, the blocks may be three bit memory blocks, but a dynamic reassignment of read margins and verify levels can result in the block acting like a two bit memory block. Memory blocks may be designed for a certain number of bits per cell (i.e. number of states) and the programming is based on that number. However, single level cell (SLC) programming is also possible in addition to programming according to the number of bits per cell that the memory is designed for. Multiple SLC programming steps can be used to modify the number of states for certain memory cells.

This dynamic reassignment of the programmed state may be performed when an erase cycle is needed. The original data and newer data can be programmed on the same SLC block and the erase can be performed once (e.g. the erase is every two programs rather than one program). As a result, the number of program/erase ("P/E") cycling can be doubled while the SLC is converted to a different type of memory (different number of states) that may have better endurance and faster programming. Decreasing the number of states for each memory cell may result in the P/E ratio being increased. The increase of the block programming allowed per erase instance may help increase the cycling performance of the flash memory, mainly due to the reduced stress time from the erase. Twice as many programming operations can be carried out and thus the TBW (total byte written) to the system can be increased. This system/method smartly manages the data written to the flash memory during the program and erase operation to the memory blocks. By doing so, the erase counts to the memory may be effectively reduced while the performance of the write can be enhanced.

In one example, the memory device may be an 8 states or 3 bit per cell memory. The circuitry of the memory system can read/write with the 8 states, but there is no 4 state modes for this memory. The circuitry can also read/write to 2 states using SLC programming. Regardless of the number of states that the memory is designed for, it can still perform SLC programming with 2 states. Using multiple SLC programming steps and modifying both the read margin and program verify level the 8-state memory can be used as 4-state memory. This provides interchangeability for different technologies that were previously incompatible. In other examples, the number of states (or bits per cell) may be different, but SLC may still be used to treat the memory as if it was designed for a different number of states.

Figure 1A:
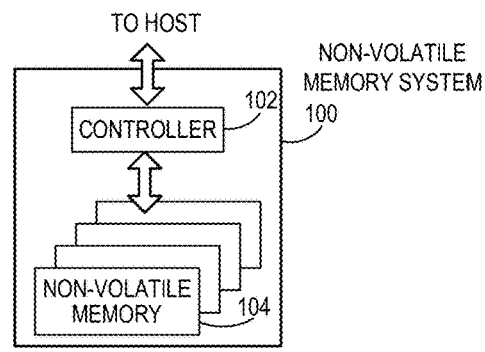
FIG. 1A is a block diagram of an example non-volatile memory system.

FIGS. 1A-2B are exemplary memory systems which may implement BDRL. FIG. 1A is a block diagram illustrating a non-volatile memory system. The non-volatile memory system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The non-volatile memory die 104 may store an operating system for the host.

Examples of host systems include, but are not limited to, personal computers (PCs), such as desktop or laptop and other portable computers, tablets, mobile devices, cellular telephones, smartphones, personal digital assistants (PDAs), gaming devices, digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

Although in the example illustrated in FIG. 1A, non-volatile memory system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
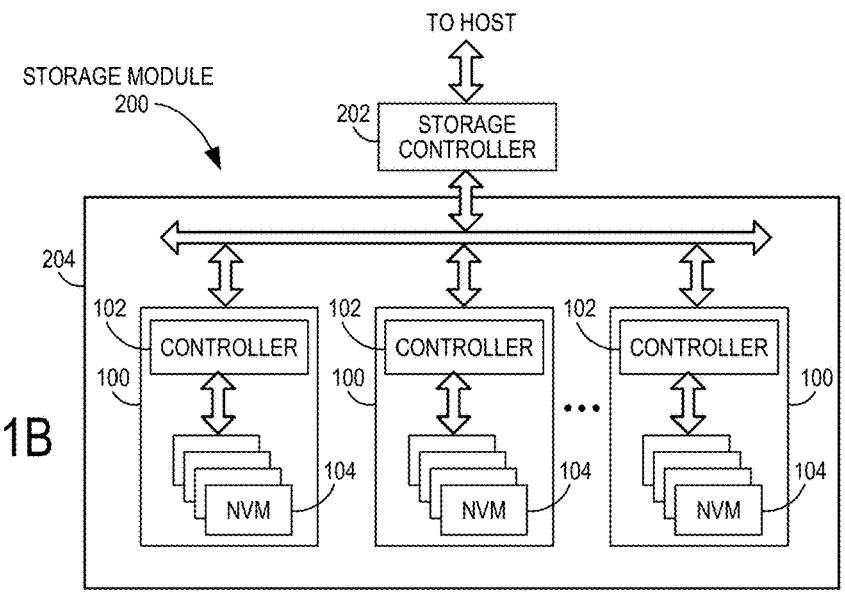
FIG. 1B is a block diagram of a storage module that includes a plurality of non-volatile memory systems.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
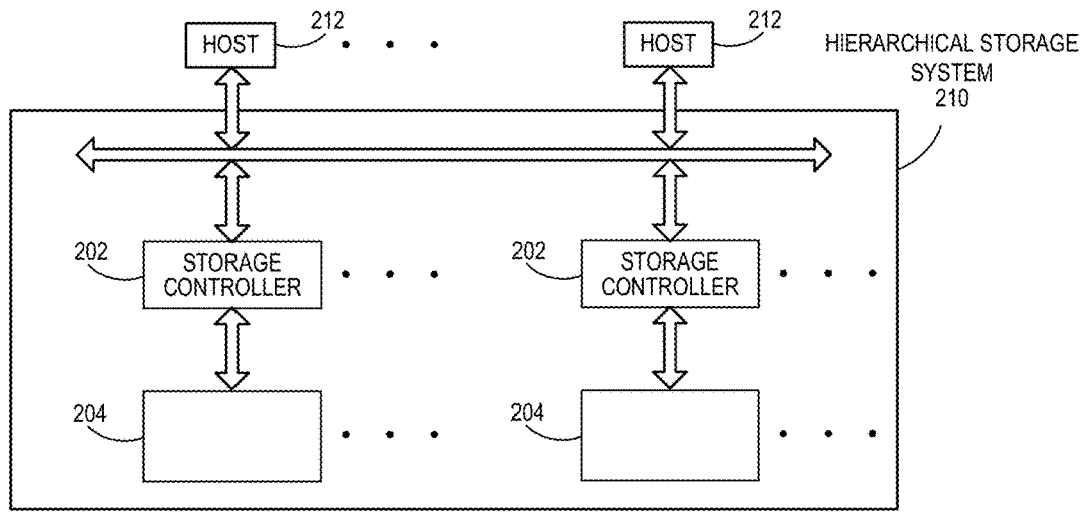
FIG. 1C is a block diagram of a hierarchical storage system.

FIG. 1C is a block diagram illustrating a hierarchical storage system. A hierarchical storage system 210 includes a plurality of storage controllers 202, each of which control a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
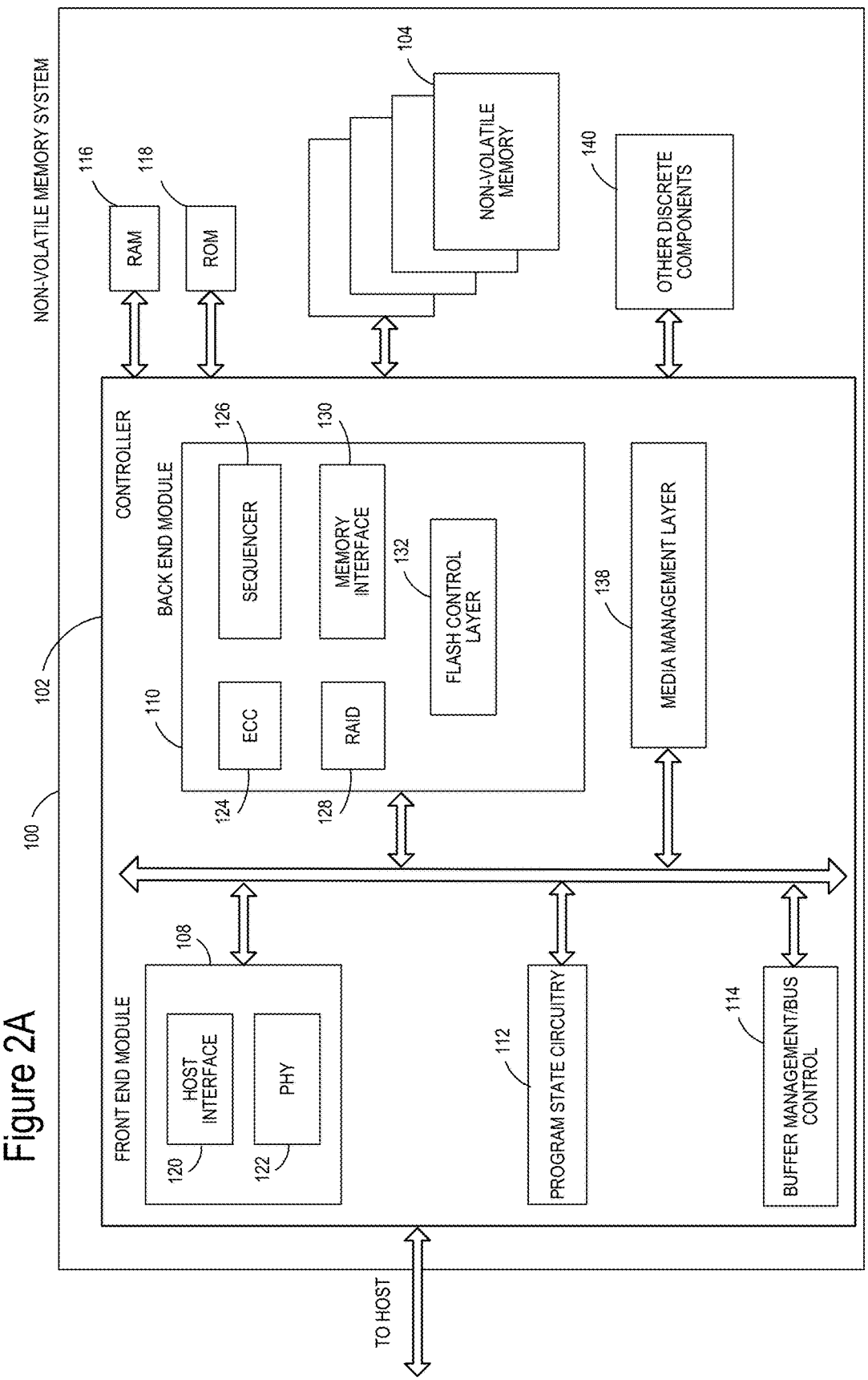
FIG. 2A is a block diagram of exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 104, for example, that comprises instructions executable with a processor to implement one or more of the features of the module. When any one of the modules includes the portion of the memory that comprises instructions executable with the processor, the module may or may not include the processor. In some examples, each module may just be the portion of the memory 104 or other physical memory that comprises instructions executable with the processor to implement the features of the corresponding module.

The controller 102 may include program state circuitry 112. The program state circuitry 112 may be used for assigning a different number of states to cells in a block. That number may be different from what the block was designed for. As described, SLC programming may be used to generate a different distribution of states. For example, the memory 104 may be designed for 8 states per cell (3 bits per cell), but using SLC programming, certain blocks may be programmed with only 4 states (2 bits per cell) even if the other circuitry of the NAND or memory system was only designed for 8 states per cell.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

The FTL or MML 138 may be integrated as part of the flash management that may handle flash errors and interfacing with the host. In particular, MML may be a module in flash management and may be responsible for the internals of NAND management. In particular, the MML 138 may include an algorithm in the memory device firmware which translates writes from the host into writes to the flash memory 104. The MML 138 may be needed because: 1) the flash memory may have limited endurance; 2) the flash memory 104 may only be written in multiples of pages; and/or 3) the flash memory 104 may not be written unless it is erased as a block. The MML 138 understands these potential limitations of the flash memory 104 which may not be visible to the host. Accordingly, the MML 138 attempts to translate the writes from host into writes into the flash memory 104. As described below, erratic bits may be identified and recorded using the MML 138. This recording of erratic bits can be used for evaluating the health of blocks.

Figure 2B:
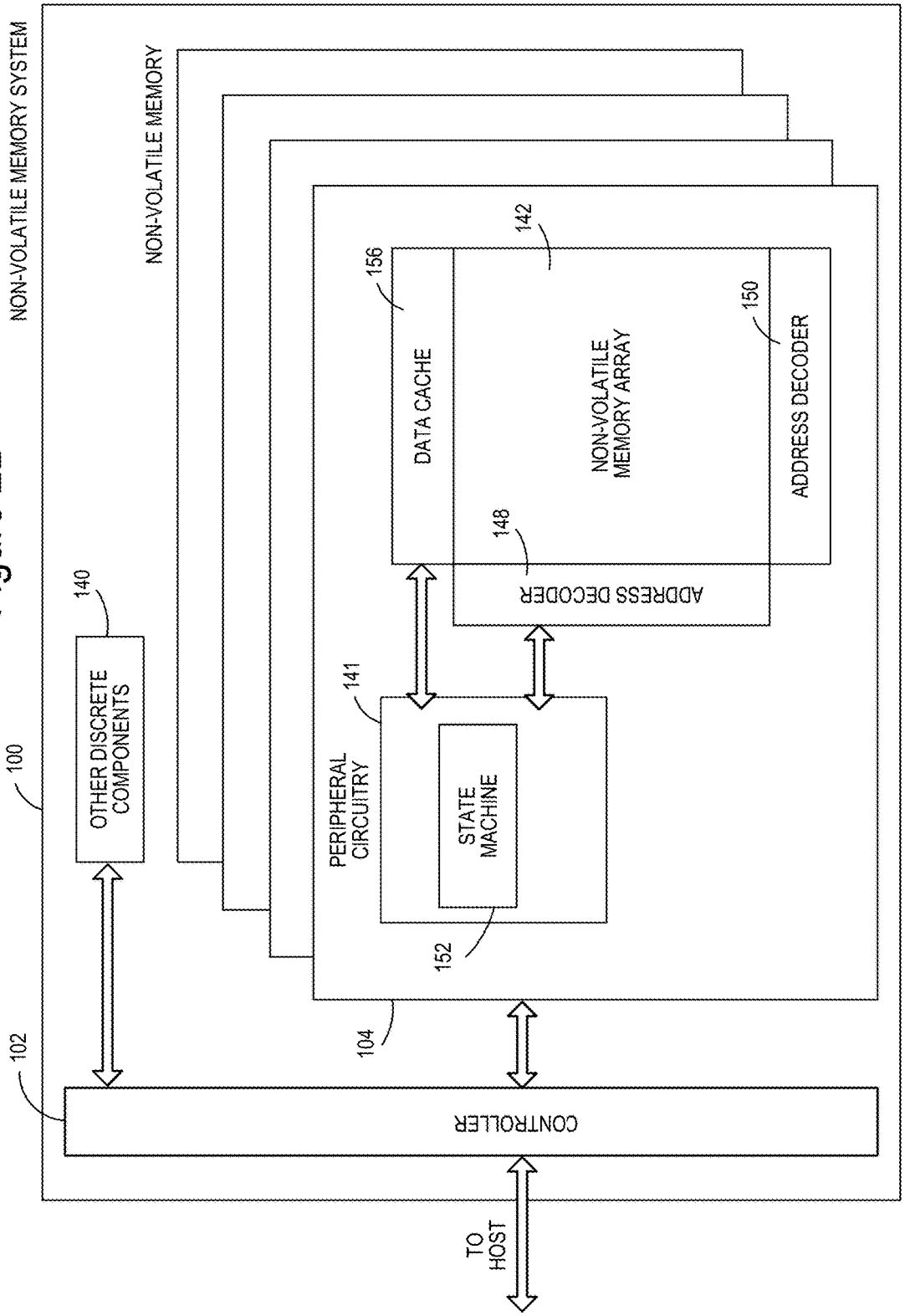
FIG. 2B is a block diagram of exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data. Exemplary peripheral circuitry 141 may include clocks, pumps, ESD, current shunt, current sink, and/or closely-packed logic circuits.

The logic interpretation of the program state is achieved by the NAND read circuits by setting appropriate read levels against the expected charge states. The data into and from the NAND chip may be controlled by the MCU or ASIC circuitry and a data processing algorithm unit of the system where the data is interpreted and further transferred to the host.

Figure 3:
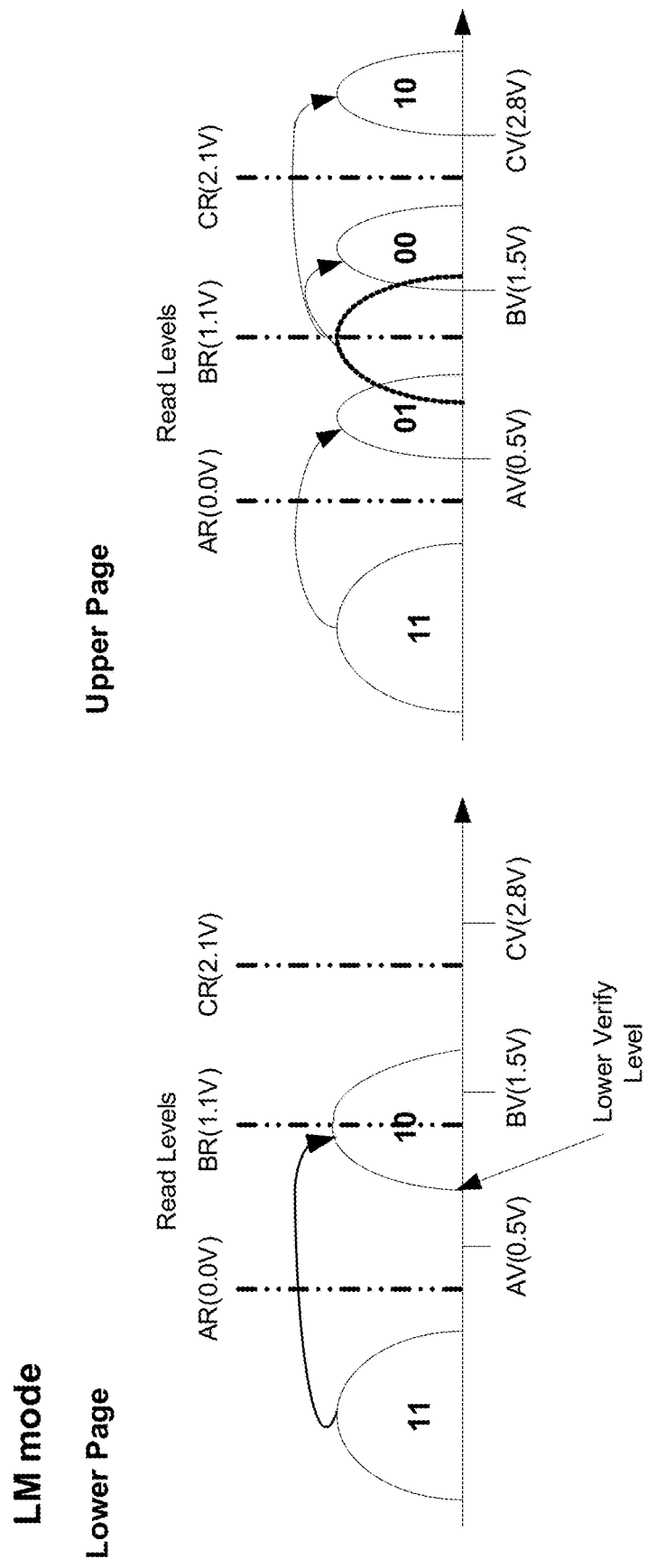
FIG. 3 is a diagram illustrating charge levels in a multi-level cell memory operated to store two bits of data in a memory cell.
Figure 4:
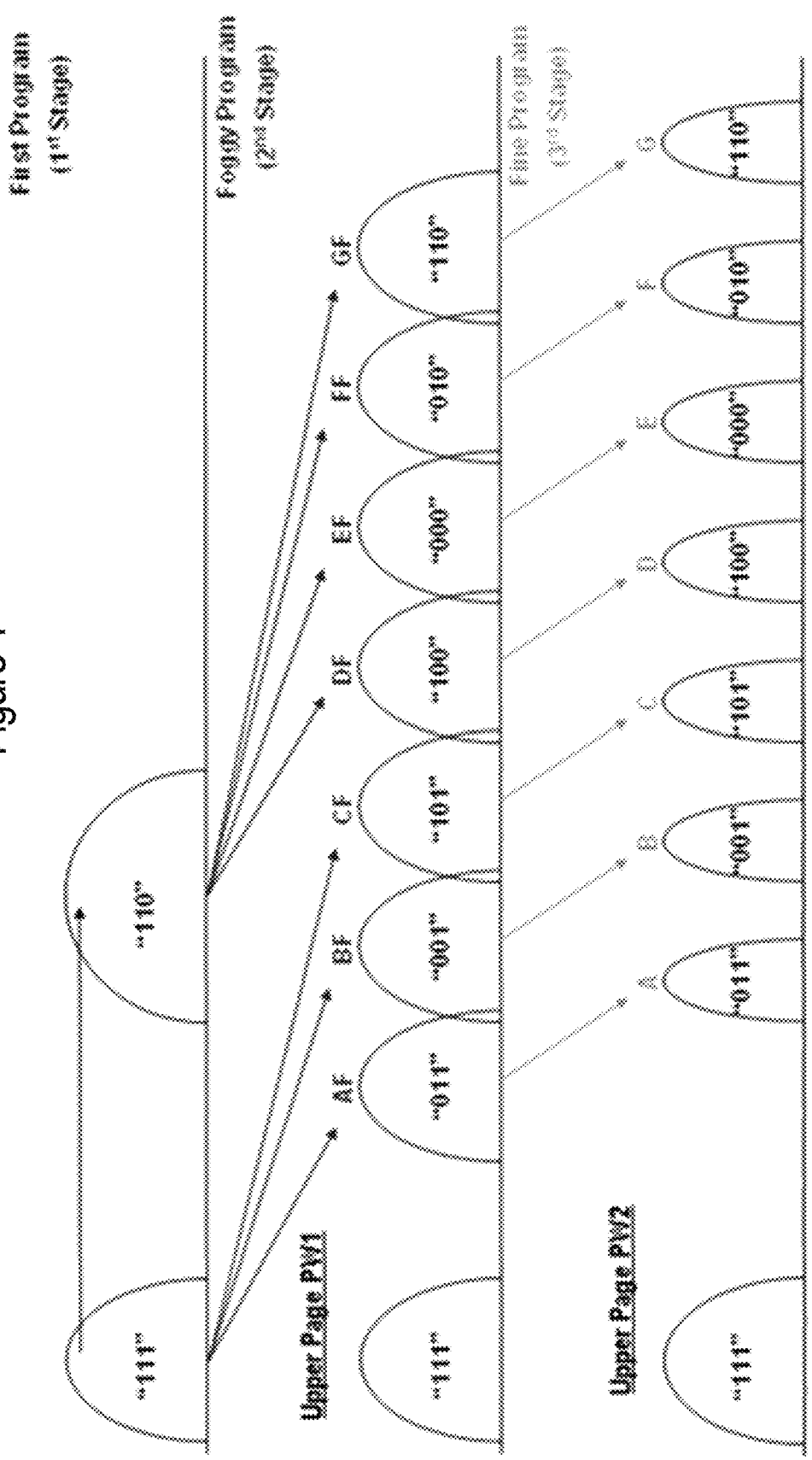
FIG. 4 is a diagram illustrating charge levels in a multi-level cell memory

FIG. 3 is a diagram illustrating charge levels in cell memory. The charge storage elements of the memory cells are most commonly conductive floating gates but may alternatively be non-conductive dielectric charge trapping material. Each cell or memory unit may store a certain number of bits of data per cell. In FIG. 3, MLC memory may store four states and can retain two bits of data: 00 or 01 and 10 or 11. Alternatively, MLC memory may store eight states for retaining three bits of data as shown in FIG. 4. In other embodiments, there may be a different number of bits per cell.

The right side of FIG. 3 illustrates a memory cell that is operated to store two bits of data. This memory scheme may be referred to as eX2 memory because it has two bits per cell. The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. FIG. 3 illustrates a two-bit per cell memory scheme in which either four states (Erase, A, B, C) or with two states of SLC memory. This two-bit per cell memory (i.e. eX2) memory can operate as SLC or as four state MLC. Likewise, as described with respect to FIG. 4, three-bit per cell memory (i.e. eX3) can operate either as SLC or as eight state MLC. The NAND circuitry may be configured for only a certain number of bit per cell MLC memory, but still operate as SLC. In other words, MLC memory can operate as a MLC or SLC, but with regard to the MLC operation three bit per cell memory cannot operate as two bit per cell memory and vice-versa. The embodiments described below utilize any MLC memory scheme's ability to work with SLC to then operate at different bits per cell.

FIG. 3 illustrates one implementation of the four charge levels used to represent two bits of data in a memory cell. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. The read margins are established for identifying each state. The three read margins (AR, BR, CR) delineate the four states. Likewise, there is a verify level (i.e. a voltage level) for establishing the lower bound for programming each state.

FIG. 3 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state or erase state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

FIG. 4 is a diagram illustrating charge levels in a multi-level cell memory operated to store three bits of data in a memory cell. FIG. 4 illustrates MLC memory with three bits of data which are stored in a single cell by establishing eight states or voltage level distinctions. This memory may be referred to as X3 memory. FIG. 4 illustrates the stages that may be used for programming three bit memory. In a first stage, the voltage levels are divided out at two levels, and at the second stage (i.e. foggy program), those two levels are divided up into the eight states without setting the distinct levels between states. At the third stage (i.e. fine program), the voltage levels for each of the eight states are separated and distinct. The fine programming establishes the voltage levels for each of the states. As compared with two bit memory, the three bit memory in FIG. 4 requires more exact programming voltages to avoid errors. Electron movement or loss from the charge values may result in problems. Endurance and programming speed may decrease based on the exact programming that is required.

In alternative embodiments, there may be memory schemes with increased bits per cell (e.g. 4 bits per cell or X4 memory). Each of those memory schemes may operate using that number of bits per cell (e.g. "n" bits per cell where n is an integer of 2 or more), but also by using SLC programming. Accordingly, the system and methods described herein will allow operation under n bits per cell or using SLC programming to act like a different bit per cell memory (e.g. any number less than n).

Figure 5:
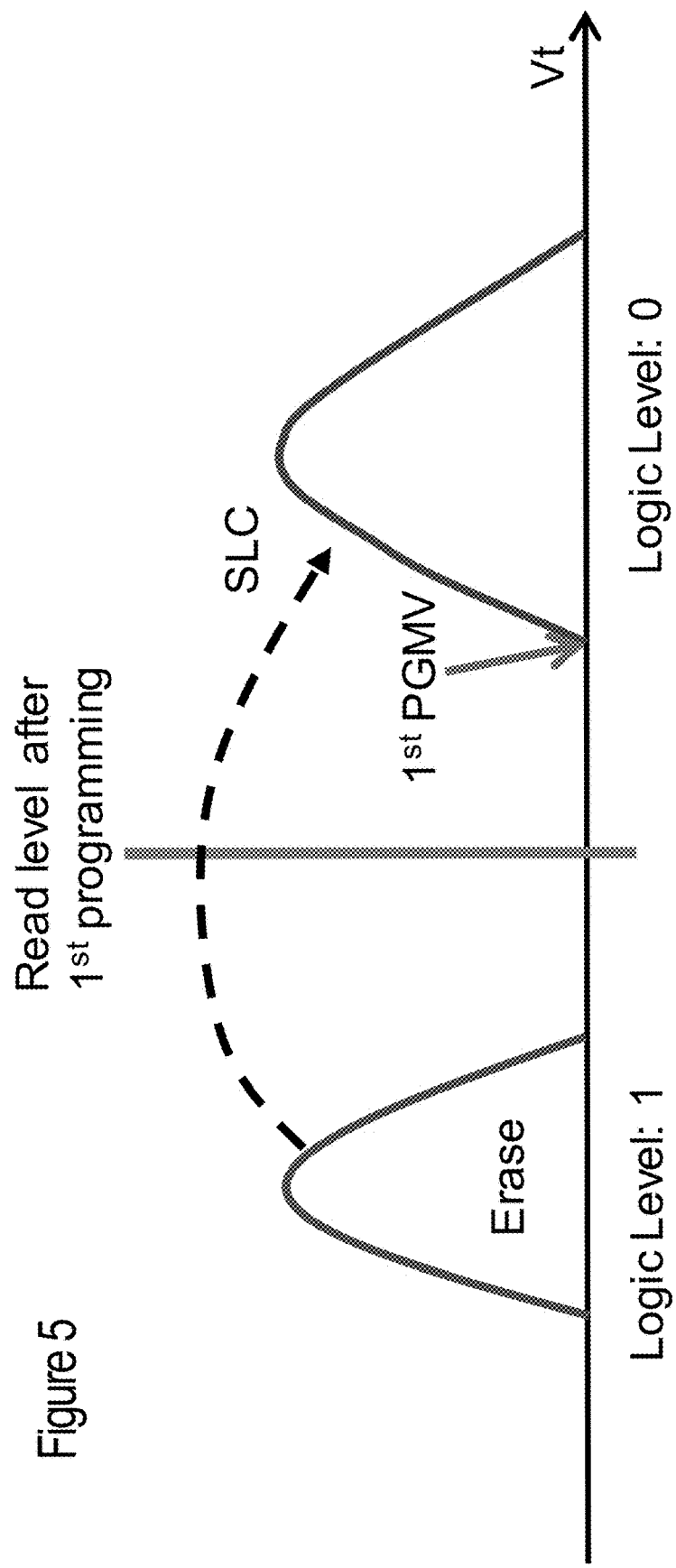
FIG. 5 is a diagram of charge distribution with single level cell programming.

FIG. 5 is a diagram of charge distribution with single level cell (SLC) programming. The two states are the erase state and the program state. This particular cell can provide either a 0 or a 1 as the stored bit. FIG. 5 illustrates the voltage along the x-axis with both SLC states. The distributions represent the range of voltage levels for each state. The programming performed for these two states is SLC programming. Even for memory that is multiple bits per cell, this type of SLC programming may still be performed. In other words, multiple bit per cell memory can still be used with two states from SLC programming. This may be the first programming after a fresh erase.

Figure 6:
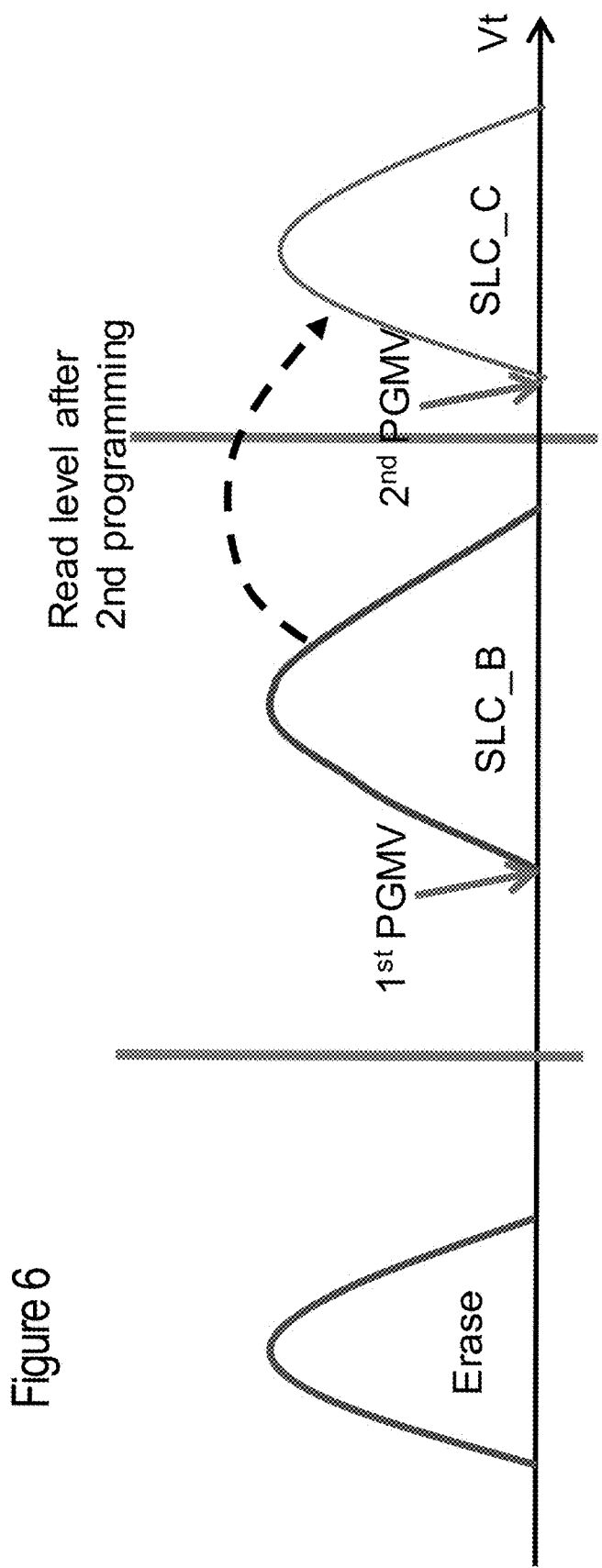
FIG. 6 is a diagram of charge distribution showing multiple single level cell programming.
Figure 7:
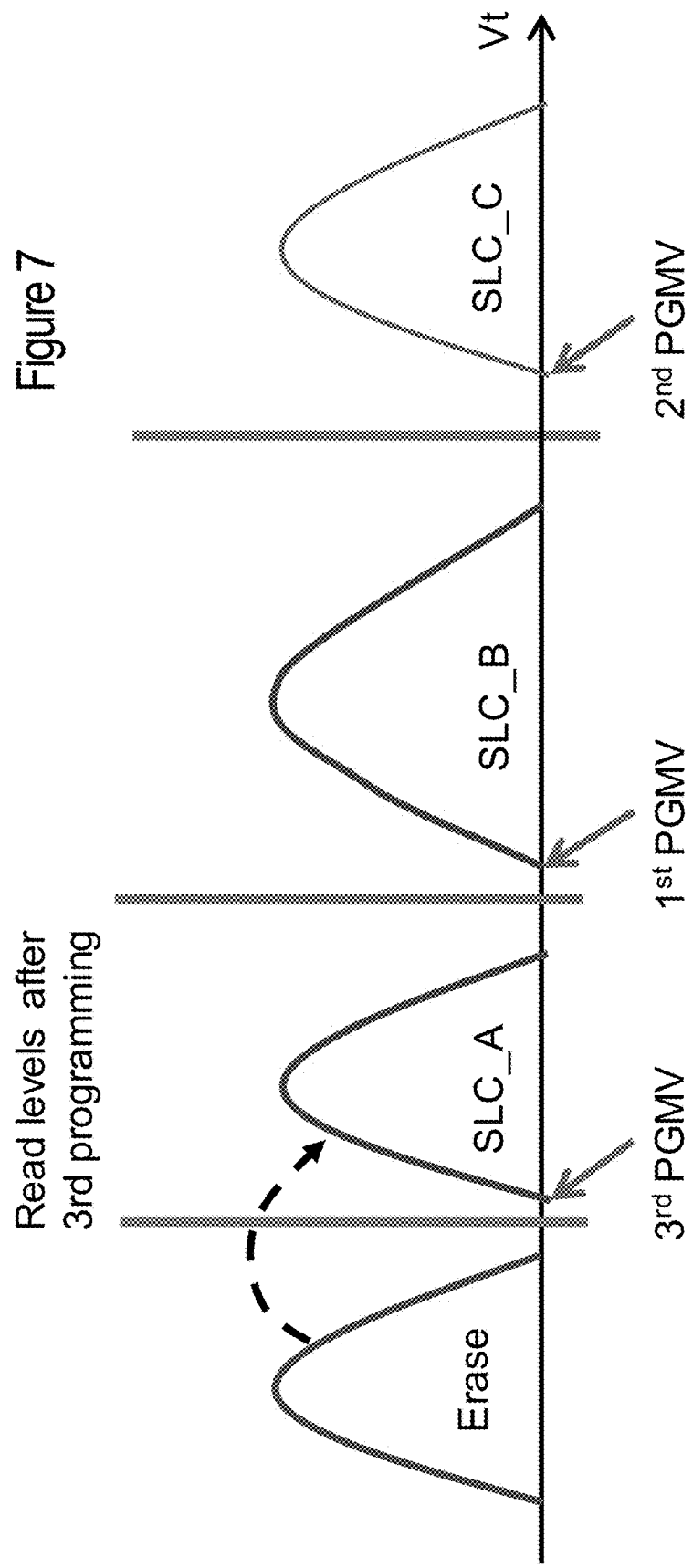
FIG. 7 is another diagram of charge distribution showing multiple single level cell programming.

FIG. 6 is a diagram of charge distribution showing multiple single level cell programming. In one embodiment, the programming shown in both FIG. 6 and FIG. 7 is part of a second programming that follows the initial programming of FIG. 5. Once the block is fully programmed, the new data may be received for programming. As described with respect to FIG. 8, there may be a flag that is set to identify whether the block is being utilized for a different scheme. In particular, this flag may identify whether the block is fully programmed (e.g. 3 bit per cell memory being programmed with 3 bits per cell) or partially programmed using multiple SLC programs (e.g. 3 bit per cell memory being programmed with 2 bits per cell). The secondary programming shown with respect to FIG. 6 and FIG. 7 may only be performed when the flag identifies this partial programming.

FIG. 6 illustrates that the program state (from FIG. 5) can be reprogrammed to be another program state. The two programmed states shown in FIG. 6 are the B state (SLC_B) and the C state (SLC_C). The B state is the original state programmed with the first SLC programming operation and the C state is the newly programmed state. The C state is programmed from the original program state (from FIG. 5) which is now the B state. After programming the read levels are adjusted to distinguish between the states. The program verify voltage (PGMV) of the C state is set to be outside of the read level. The reassignment of the read margin and program verify voltages can be used to establish a different number of states.

FIG. 7 is another diagram of charge distribution showing multiple single level cell programming. The programming in FIG. 7 may be additional programming or may be part of (e.g. parallel to) the programming shown in FIG. 6. The erase state is programmed to be the A state (SLC_A). The A state is newly programmed from the original erase state. The third program verify level (PGMV) is set to be outside of the erase state. Accordingly, the read margin separates the erase state from the A state. Likewise, the read margin in front of the B state is outside of the A state. In an alternative embodiment, the C state may be programmed based on the erase state. In other words, the original erase state is used for programming the new state C. The embodiment shown in FIG. 6 illustrates that state C is programmed from the original program state (now state B) rather than the erase state.

FIG. 7 illustrates the establishment of four states (e.g. 2 bits per cell). The reassignment of the programmed states may allow memory configured for 8 states (e.g. 3 bits per cell) to be repurposed into four states using the SLC programming described. This may be referred to as dynamic reassignment of the programmed states or of the distribution. The initial programming (e.g. FIG. 5) may refer to old data that is assigned the lower page, while the new data of the subsequent programming is assigned to the upper page.

The assignment of a different bit per cell scheme may be done at the block level. For example, in a 3 bit per cell NAND, there may be certain blocks that are treated as 2 bit per cell. Alternatively, the management of the bit per cell structure may be at a larger scale (e.g. meta-block, plane, die, etc.) or at a smaller scale (e.g. page level) in other embodiments.

Figure 8:
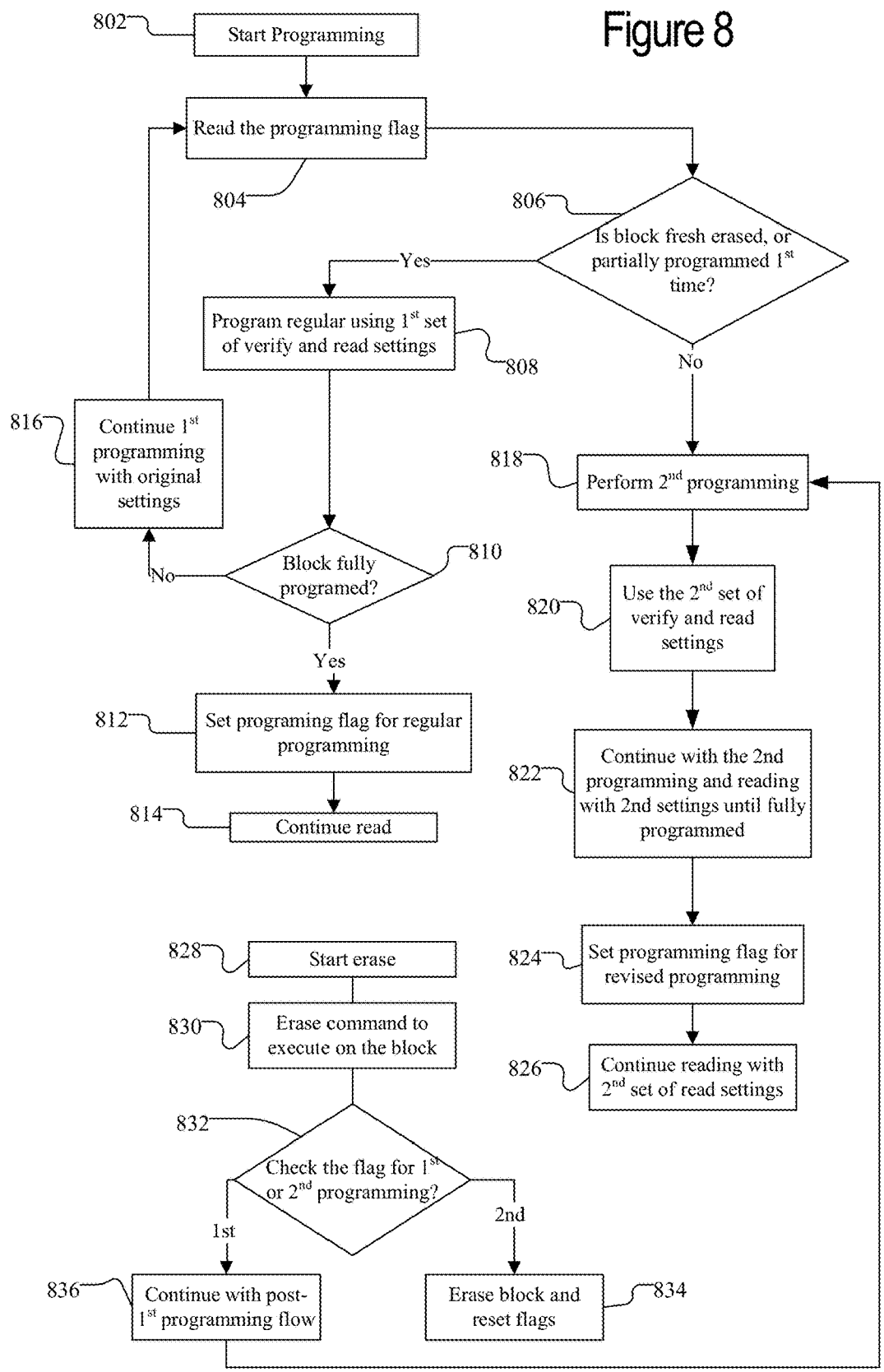
FIG. 8 is a flowchart illustrating program state modification.

FIG. 8 is a flowchart illustrating program state modification. The programming is started in block 802. The programming flag is read in block 804. The programming flag may indicate whether the memory is in a default mode or in a mode where the number of states has been modified with SLC programs. In block 806, the memory block is checked to see if it is freshly erased or partially programmed for the first time. The memory block is programmed using a first set of verify and read settings in block 808. The first set of verify and read settings correspond to a first programming (i.e. FIG. 5). Conversely, a second set of verify and read settings correspond to a second programming (i.e. FIG. 6 and/or FIG. 7). When the block is fully programmed in block 810, the programming flag is set for regular programming (default mode) in block 812. The read can be continued in block 814. In block 810, fi the block is not fully programmed, then the first programming continues with the original settings in block 816.

Referring back to block 806, when the block is not freshly erased or partially programmed, the second programming is performed in block 818. Then a second set of verify and read settings are utilized for the second programming in block 820. The second programming is continued with the second settings until it is fully programmed in block 822. The programming flag is set for the revised or reassigned (second) programming state mode in block 824. The reading is continued with the second set of read settings in block 826.

When the erase process is started in block 828, the erase command is issued in block 830. The programming flag is checked to determine if the flag identifies the first programming or the second programming in block 832. When the programming flag identifies the second programming then the block is erased and the flag is reset in block 834. If the flag identifies the first programming, then the post first programming flow is continued in block 836. In particular, the first programming is performed in block 818.

The methods, devices, processing, circuitry, and logic described above may be implemented in many different ways and in many different combinations of hardware and software. For example, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed.

The processed medium may then be stored in a computer and/or machine memory. In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

We claim:

1. A storage device comprising:
   a memory comprising memory blocks that have circuitry for at least three bits per cell in the memory blocks and that use a default programming mode for the at least three bits per cell;
   a controller coupled with the memory that is configured to receive a programming request for the memory blocks; and
   program state circuitry that operates with the default programming mode using programming for the at least three bits per cell or operates with a modified programming mode using single level cell (SLC) programming, wherein the modified programming mode with SLC includes first programming at least some of the memory blocks that have circuitry for at least three bits per cell using the SLC programming with a program verify level corresponding to SLC and second programming using the SLC programming with a modified program verify level corresponding with two bits per cell rather than the at least three bits per cell.

2. The storage device of claim 1 wherein the program state circuitry is part of the controller.

3. The storage device of claim 1 wherein the at least three bits per cell comprises three bits per cell.

4. The storage device of claim 3 wherein the program state circuitry provides for four states after the second program, while the memory circuitry is designed for three bits per cell and not capable of two bits per cell.

5. The storage device of claim 1 wherein the memory block is erased before the first programming.

6. The storage device of claim 1 wherein the memory comprises a three-dimensional (3D) memory configuration, and wherein a controller is associated with operation of and storing to the flash memory.

7. The storage device of claim 1 further comprising:
   a flag stored by the controller to identify that the block has a value of the bits per cell for a read operation, wherein program verify levels depend on the value of bits per cell.

8. The storage device of claim 1 wherein the second programming does not require erase.

9. The storage device of claim 1 wherein the at least three bits per cell in the memory blocks comprises four bits per cell.

10. The storage device of claim 9 wherein the second programming with the modified program verify level corresponds with two bits per cell.

11. The storage device of claim 9 wherein the program state circuitry provides for four states after the second program, while the memory is designed for four bits per cell.

12. A storage device comprising:
    a means for programming a memory with at least three bits per cell memory blocks using a default programming mode for the at least three bits per cell;
    a means for receiving a programming request for the at least three bits per cell memory blocks;
    a means for programming the at least three bits per cell memory blocks with the default programming mode using three bits per cell programming; and
    a means for programming the at least three bits per cell memory blocks with a modified programming mode using single level cell (SLC) programming, wherein the modified programming mode with SLC includes first programming the at least three bits per cell memory blocks using single level cell (SLC) programming with a program verify level corresponding to SLC, and includes
    second programming the at least three bits per cell memory blocks using the SLC programming with a modified program verify level corresponding with a fewer bits per cell than the at least three bits per cell.

13. The storage device of claim 12 wherein the means for utilizing SLC programming is part of a controller.

14. The storage device of claim 12 wherein the at least three bits per cell comprises three bits per cell and the fewer bits per cell comprises two bits per cell.

15. The storage device of claim 14 further comprising:
    means for providing four states after the second program despite being designed for three bits per cell and not capable of two bits per cell.

16. The storage device of claim 12 further comprising:
    means for erasing the memory block before the first programming.

17. The storage device of claim 12 further comprising:
    means for storing a flag to identify that the block has a value of the bits per cell for a read operation, wherein program verify levels depend on the value of bits per cell.

18. The storage device of claim 12 wherein the second programming does not require erase.

19. The storage device of claim 12 wherein the at least three bits per cell in the memory blocks comprises four bits per cell and the second programming with the modified program verify level corresponds with two bits per cell.

\* \* \* \* \*